(12) United States Patent
Miyatake et al.

(10) Patent No.: US 7,414,908 B2
(45) Date of Patent: Aug. 19, 2008

(54) MAGNETIC MEMORY DEVICE

(75) Inventors: Hisatada Miyatake, Ohtsu (JP); Toshio Sunaga, Ohtsu (JP)

(73) Assignee: International Business Machines Corporation, Armonk, NY (US)

( * ) Notice: Subject to any disclaimer, the term of this patent is extended or adjusted under 35 U.S.C. 154(b) by 333 days.

(21) Appl. No.: 11/000,486

(22) Filed: Nov. 30, 2004

(65) Prior Publication Data

US 2005/0122769 A1    Jun. 9, 2005

(30) Foreign Application Priority Data

Dec. 3, 2003    (JP)    ............... 2003-403983

(51) Int. Cl.
  *G11C 7/02*    (2006.01)
  *G11C 11/06*   (2006.01)
  *G11C 5/08*    (2006.01)
  *G11C 5/14*    (2006.01)

(52) U.S. Cl. ............... 365/210; 365/55; 365/66; 365/207; 365/209; 365/158; 365/226; 327/55; 327/57

(58) Field of Classification Search .......... 365/207, 365/209, 210, 158, 66; 327/55, 57
See application file for complete search history.

(56) References Cited

U.S. PATENT DOCUMENTS 6,778,435 B1 *  8/2004  Han et al. ............... 365/174
6,898,113 B2 *  5/2005  Tsuji ..................... 365/158
6,999,331 B2 *  2/2006  Huang .................... 365/49
2002/0011876 A1 * 1/2002  Shin ...................... 327/66
2003/0223269 A1 * 12/2003 Hidaka ................... 365/171
2004/0174731 A1 * 9/2004  Saito et al. .............. 365/145

FOREIGN PATENT DOCUMENTS

| JP | 06-119784      | 4/1994  |
| JP | 2000-207887    | 7/2000  |
| JP | 2001-358222    | 11/2001 |
| JP | 2002511631     | 4/2002  |
| JP | 2002-175694    | 6/2002  |
| JP | 2002197853 A2  | 7/2002  |
| JP | 2003-157671    | 5/2003  |

* cited by examiner

*Primary Examiner*—Amir Zarabian
*Assistant Examiner*—Ly Duy Pham
(74) *Attorney, Agent, or Firm*—Richard M. Goldman

(57) ABSTRACT

A Magnetic Random Access Memory (MRAM), in which very little current flows through MTJ elements and very little voltage is applied across them, the MRAM being provided with sense-amplifiers capable of amplifying the potential difference between their corresponding pairs of bit lines at high speed. This is accomplished by a sense amplifier including CMOS inverters cross-connected or connected in loop, a P-channel MOS transistor for shutting the power off during standby, and N-channel MOS transistors for initializing the output of the sense amplifier during standby. A ground terminal of the inverter is connected to a bit line through a transistor of a bit switch, and a ground terminal of the inverter is connected to a bit line through a transistor of a bit switch.

5 Claims, 4 Drawing Sheets

MAGNETIC MEMORY DEVICE

FIELD OF THE INVENTION

The present invention relates to a magnetic memory device, and more particularly to an MRAM Magnetic Random Access Memory) using MTJ (Magnetic Tunnel Junction) elements.

BACKGROUND ART

FIG. 4 shows a sense amplifier in an MRAM proposed in R. Scheuerlein, et al., "A 10 ns Read and Write Non-Volatile Memory Array Using a Magnetic Tunnel Junction and FET Switch in Each Cell," IEEE ISSCC Digest of Technical Papers, pp. 128–129, February 2000. The MRAM in Scheuerlein et al., uses magnetic memory cells MC, each including an MTJ element 1 and an access transistor (N-channel MOSFET (Metal Oxide Semiconductor Field Effect Transistor), TN1. The MTJ element 1 is connected to a bit line BLT, and connected in series to the access transistor TN1 that is turned on in response to a word line WL.

On the other hand, each of reference magnetic memory cells RefMC is connected to a complementary bit line BLC. The magnetic memory cell RefMC includes an MTJ element 2 and an access transistor TN2. The MTJ element 2 is connected to the complementary bit line BLC, and connected in series to the access transistor TN2 that is turned on in response to a reference word line RefWL. The MTJ element 1 is for data storage, whereas the MTJ element 2 is for reference.

The bit line pair BLT and BLC are connected to a sense amplifier 5 via a bit switch (also called a column switch or column select gate) 4. The bit switch 4 includes N-channel MOS transistors TN3 and TN4 that are turned on in response to a column select signal CS from a column decoder (not shown). The sense amplifier 5 senses and amplifies the electric potential difference between the bit lines BLT and BLC.

A clamp circuit 6 is connected between the bit switch 4 and the sense amplifier 5 in order to prevent the application of a voltage, equal to or higher than the breakdown voltage, across the MTJ elements 1 and 2, and minimize the bias voltage dependence of tunneling magneto-resistance (TMR), that is, the phenomenon that TMR and its ratio of change decrease depending on the bias voltage. The clamp circuit 6 includes N-channel MOS transistors TN5 and TN6 that receive a constant bias voltage Vbias to clamp the voltage across the MTJ elements 1 and 2 at a predetermined voltage (=bias voltage Vbias−threshold voltage Vth of the transistors TN5 and TN6).

In the sense amplifier 5, constant currents always flow from constant current sources 7a and 7b into resistor elements 8a and 8b, respectively. Therefore, when the bit switch 4 is off, no potential difference appears between output nodes NO1 and NO2.

Then, when the access transistors TN1 and TN2 are turned on in response to the word line WL and the reference word line RefWL, and the bit switch 4 is turned on in response to the column select signal CS for the purpose of reading data from the magnetic memory cell MC, sense currents flow through the MTJ elements 1 and 2, respectively. Since the MTJ element 1 has a resistor value R1 different from a resistor value R2 of the MTJ element 2 while the resistor elements 8a and 8b have the same resistor value $Z_L$, a sensed potential difference |OUT−OUTN| appears between the output nodes NO1 and NO2. This potential difference is amplified by a current-mirror amplifier 9.

In such a sense amplifier 5, the constant current sources 7a, 7b, the resistor elements 8a, 8b, and the amplifier 9 consume DC currents. A bias voltage generation circuit to generate the bias voltage Vbias, not shown, also consumes DC current. Since these DC currents continue to flow as long as power is supplied to the MRAM even during standby state where the MRAM waits ready for its activation, the DC current consumption is not negligible in the field of portable devices that is considered to be an important area of application of MRAMs.

Further, the current-mirror amplifier 9 outputs a intermediate potential so that another amplifier needs to be provided at a later stage after the current-mirror amplifier 9. In addition, direct or pass-through current flows from the power supply to the ground in the post-amplifier, that is, the amplifier provided at a later stage after the current-mirror amplifier 9.

OBJECTS OF THE INVENTION

It is an object of the present invention to provide a magnetic memory device with low current consumption.

It is another object of the present invention to provide a magnetic memory device in which almost no sense current flows during sense-amplification.

It is still another object of the present invention to provide a magnetic memory device in which only very little voltage is applied to magnetic memory cells.

It is yet another object of the present invention to provide a magnetic memory device with an amplifier circuit that can amplify the potential difference between each pair of bit lines at high speed.

SUMMARY OF THE INVENTION

The invention described herein provides an MRAM, in which very little current flows through MTJ elements and very little voltage is applied across them, and which is provided with sense-amplifiers capable of amplifying the potential difference between their corresponding pairs of bit lines at high speed.

The sense amplifier includes CMOS inverters cross-connected or connected in loop, a P-channel MOS transistor for shutting the power off during standby, and N-channel MOS transistors for initialiging the output of the sense amplifier during standby. A ground terminal of the inverter is connected to a bit line through a transistor of a bit switch, and a ground terminal of the inverter is connected to a bit line through a transistor of the bit switch.

DETAILED DESCRIPTION OF THE INVENTION

Figure 1:
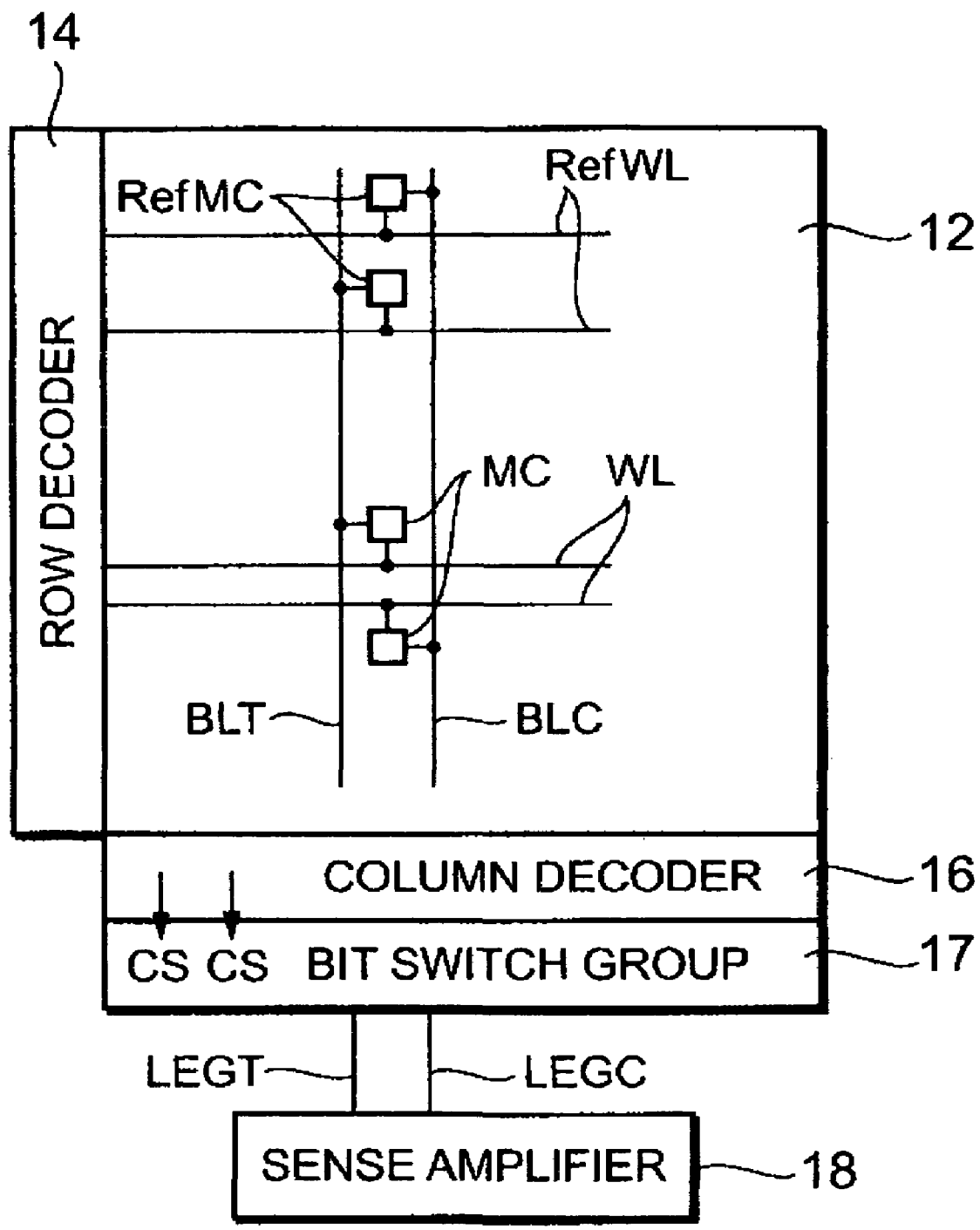
FIG. 1 is a functional block diagram showing a memory cell array and its surrounding structure in an MRAM according to an embodiment of the present invention.

According to the present invention, a magnetic memory device includes a plurality of word lines, a plurality of pairs of bit lines, a plurality of magnetic memory cells, and a plurality of amplifier circuits. Each of the magnetic memory cells is connected to one of the word lines and either one or both of a pair of bit lines. Each of the amplifier circuits is connected to one of the bit line pairs to sense the current in the magnetic memory cell. The amplifier circuit includes first and second inverters. The first inverter has an output terminal connected to a first output node, an input terminal connected to a second output node, a first power terminal connected to a first power supply, and a second power terminal connected to one of the pair of bit lines. The second inverter has an output terminal connected to the second output node, an input terminal connected to the first output node, a first power terminal connected to the first power supply, and a second power terminal connected to the other of the pair of bit lines.

According to this magnetic memory device, when the voltage on one bit line of the bit line pair is higher than the voltage on the other bit line of the pair, the voltage at the first output node becomes higher than the voltage at the second output node. In this case, the second inverter equalizes the voltage of the second output node to that of the second power supply, and the first inverter equalizes the voltage of the first output node to that of the first power supply. On the other hand, when the voltage on one bit line of the pair is lower than the voltage on the other bit line of the pair, the voltage at the first output node becomes lower than the voltage at the second output node. In this case, the second inverter equalizes the voltage of the second output node to that of the first power supply, and the first inverter equalizes the voltage of the first output node to that of the second power supply. In other words, the amplifier circuit amplifies the difference in electric potential between the pair of bit lines to latch data read out of the magnetic memory cell. Therefore, almost no sense current flows through the magnetic memory cell with only very little voltage across it.

Preferably, the first inverter includes transistors of first conductive type and of second conductive type. The transistor of first conductive type has a conducting terminal connected to the first power supply, another conducting terminal connected to the first output node, and a control terminal connected to the second output node. The transistor of second conductive type has a conducting terminal connected to one of the pair of bit lines, another conducting terminal connected to the first output node, and a control terminal connected to the second output node. The second inverter also includes transistors of first conductive type and of second conductive type. The transistor of first conductive type in the second inverter has a conducting terminal connected to the first power supply, another conducting terminal connected to the second output node, and a control terminal connected to the first output node. The transistor of second conductive type in the second inverter has a conducting terminal connected to the other of the pair of bit lines, another conducting terminal connected to the second output node, and a control terminal connected to the first output node.

In this case, the potential difference between the pair of bit lines is amplified at a higher speed. After completion of the amplification, the transistor of first or second conductive type of the first inverter is turned off, and the transistor of second or first conductive type of the second inverter is turned off. This causes no sense current to flow through the magnetic memory cell with no voltage across it.

Preferably, the amplifier circuit further includes power-off means for shutting off the power supply to the amplifier circuit during standby.

In this case, since no current flows through the amplifier circuit during standby, no sense current flows through the magnetic memory cell either. This causes no voltage across the magnetic memory cell during standby.

Preferably, the amplifier circuit further includes initialization means for precharging the first and second output nodes to a predetermined voltage during standby.

In this case, since the first and second output nodes are fixed to a predetermined voltage during standby, no malfunction occurs in the amplifier circuit.

Preferably, the amplifier circuit further includes turn-off means for turning off the transistor of second conductive type of the first inverter during standby.

In this case, since no current flows through the transistor of second conductive type of the first inverter during standby, no sense current also flows through the magnetic memory cell. This causes no voltage across the magnetic memory cell during standby.

Referring to the accompanying drawings, an embodiment of the present invention will now be described in detail. In the drawings, identical or equivalent parts are given the same reference numerals, and their descriptions are not repeated.

Referring to FIG. 1, an MRAM 10 according to an embodiment of the present invention includes a memory cell array or arrays 12, row decoders 14, column decoders 16, a bit switch group 17, and sense amplifiers 18.

The memory cell array 12 includes a plurality of magnetic memory cells Mcs arranged in rows and columns, a plurality of word lines WLs arranged corresponding to the rows, and a plurality of bit line pairs BLTs, BLCs arranged corresponding to the columns. Each of the magnetic memory cells MCs is arranged at the intersection of each word line WL and each bit line pair BLT, BLC. The magnetic memory cell is connected to the corresponding word line WL and the corresponding bit line pair BLT, BLC.

The memory cell array 12 further includes reference magnetic memory cells RefMCs and reference word lines RefWLs. Each of the reference magnetic memory cells RefMCs is arranged at the intersection of each reference word line RefWL and each bit line pair BLT, BLC. The reference magnetic memory cell RefMC is connected to the corresponding reference word line RefWL and the corresponding bit line pair BLT, BLC.

The row decoder 14 selects a word line WL in response to a row address signal. When selecting a word line WL connected to a magnetic memory cell MC connected to a bit line BLT, the row decoder 14 also selects a reference word line RefWL connected to a reference magnetic memory cell RefMC connected to the bit line BLC paired with the bit line BLT. On the other hand, when selecting a word line WL connected to a magnetic memory cell MC connected to a bit line BLC, the row decoder 14 also selects a reference word line RefWL connected to a reference magnetic memory cell RefMC connected to the bit line BLT paired with the bit line BLC.

The column decoder 16 generates a column select signal CS in response to the column address signal. The bit switch group 17 consists of a plurality of bit switches (indicated by 4 in FIG. 2). Each of the bit switches selects a bit line pair BLT, BLC in response to the column select signal CS and connects the selected bit line pair BLT, BLC to output lines LEGT, LEGC.

Figure 2:
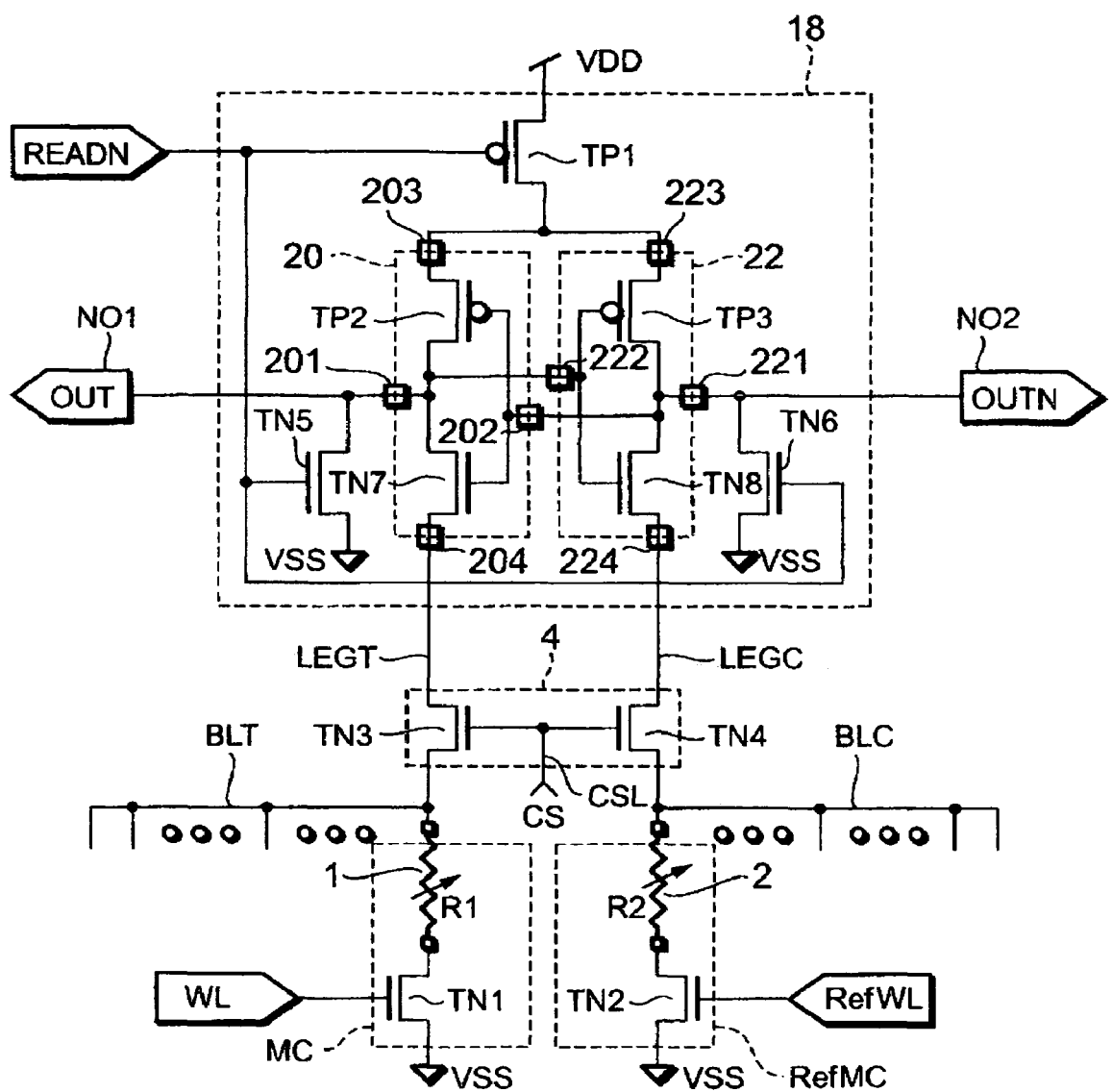
FIG. 2 is a circuit diagram showing a sense-amplifier in the MRM shown in FIG. 1.

Referring to FIG. 2, the magnetic memory cell MC is a device for storing information using a difference in electric resistance between electrodes; it includes an MTJ element having a typical structure with a free layer and a pinned layer. The magnetic memory cell MC consists of the MTJ element 1 and an access transistor TN1. The MTJ element 1 is connected between a corresponding bit line BLT and a ground line VSS. The access transistor TN1 has a gate connected to a corresponding word line WL, and is connected in series to the MTJ element 1.

The reference magnetic memory cell RefMC consists of an MTJ element 2 and an access transistor TN2. The MTJ element 2 is connected between a corresponding bit line BLC and the ground line VSS. The access transistor TN2 has a gate connected to a corresponding reference word line RefWL, and is connected in series to the MTJ element 2.

In this case, the MTJ elements 1, 2 and the access transistors TN1, TN2 are connected in this order as viewed from the bit-line side, but they may be laid out in the reverse order, that is, the access transistors TN1, TN2 and the MTJ elements 1, 2 may be connected in this order as viewed from the bit-line side.

The bit lines BLT and BLC are connected to the output lines LEGT and LEGC via the bit switch 4, and the output lines LEGT and LEGC are connected to a sense amplifier 18. The bit switch 4 includes N-channel MOS transistors TN3 and TN4. The transistors TN3 and TN4 are turned on in response to the column select signal CS from the column decoder 16.

The sense amplifier 18 includes CMOS inverters 20 and 22, a P-channel MOS transistor TP1, and N-channel MOS transistors T5 and T6. The inverter 20 has an output terminal 201 connected to an output node NO1, an input terminal 202 connected to an output node NO2, a power terminal 203 connected to a power line VDD through the transistor TP1, and a ground terminal 204 connected to the bit line BLT through the output line LEGT and the transistor TN3. The inverter 22 has an output terminal 221 connected to the output node NO2, an input terminal 222 connected to the output node NO1, a power terminal 223 connected to the power line VDD through the transistor TP1, and a ground terminal 224 connected to the bit line BLC through the output line LEGC and the transistor TN4. Thus the inverters 20 and 22 are cross-connected or connected in loop to form a latch circuit.

The inverter 20 includes a P-channel MOS transistor TP2 and an N-channel MOS transistor TN7. The transistor TP2 has a source connected to the power terminal 203, a drain connected to the output terminal 201, and a gate connected to the input terminal 202. The transistor TN7 has a source connected to the ground terminal 204, a drain connected to the output terminal 201, and a gate connected to the input terminal 202.

The inverter 22 includes a P-channel MOS transistor TP3 and an N-channel MOS transistor TN8. The transistor TP3 has a source connected to the power terminal 223, a drain connected to the output terminal 221, and a gate connected to the input terminal 222. The transistor TN8 has a source connected to the ground terminal 224, a drain connected to the output terminal 221, and a gate connected to the input terminal 222.

The transistor TP1 is connected between the power line VDD and the power terminals 203, 223 of the inverters 20, 22. The transistor TP1 has a function to supply power to the sense amplifier 18 during active periods and turn the power off during standby periods. The transistor TN5 is connected between the ground line VSS and the output node NO1. The transistor TN5 has a function to precharge or initialize the output node NO1 to the ground voltage VSS and turn off the transistor TN8 during standby periods.

The transistors TP2 and TP3, the transistors TN7 and TN8, the transistors TN5 and TN6, the output lines LEGT and LEGC, the transistors TN3 and TN4, and the bit lines BLT and BLC are formed symmetrically.

Figure 3:
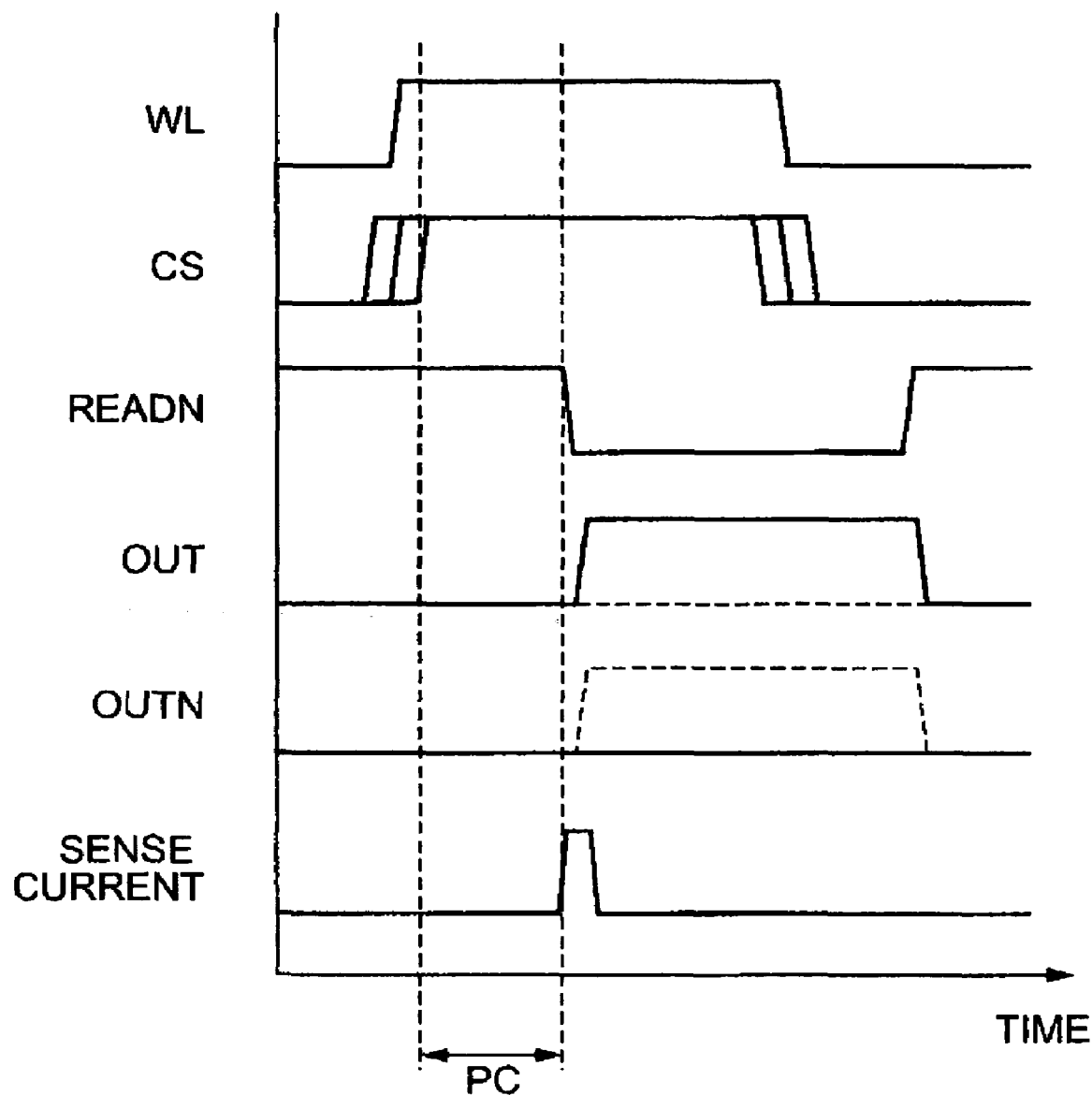
FIG. 3 is a timing chart showing the operation of the sense-amplifier shown in FIG. 2.

Referring to a timing chart of FIG. 3, the reading operation by the sense amplifier 18 will next be described.

During standby, since a read command signal READN is at an H (logic high) level, the transistor TP1 is off and the transistors TN5 and TN6 are on. Therefore, the power to the sense amplifier 18 is shut off, and the output voltages OUT and OUTN are reset to the ground voltage, so that the transistors TN7 and TN8 are off. Further, since the column select signal CS is at an L (logic low) level, the transistors TN3 and TN4 of the bit switch 4 are also off. Thus, during this time interval, there is no path for current to flow.

Under this condition, when the word lines WL and RefWL are activated, the access transistors TN1 and TN2 get turned on. Then, when the column select signal CS is activated to the H level simultaneously with, or shortly before or after the activation of the word lines WL and RefWL, the transistors TN3 and TN4 of the bit switch 4 get turned on. This causes the bit lines BLT, BLC and the output lines LEGT, LEGC to be precharged (or preconditioned) to the ground voltage. At this time, however, since the transistors TP1, TN7, and TN8 remain off, no voltage is applied to the MTJ elements 1 and 2, and no sense current flows.

After the precharging (preconditioning) period PC has elapsed, when the read command signal READN is changed to the L level, the transistor TP1 is turned on, and the transistors TN5 and TN6 are turned off, thus activating the sense amplifier 18.

The gate voltage of the transistors TP2 and TP3 is zero volt and the transistors TP2 and TP3 are on immediately after activation of the sense amplifier 18, so that current flows from the power line VDD into the output nodes NO1 and NO2 via the transistors TP2 and TP3. Since the transistors TP2 and TP3 have the same size, they have the same amperage flowing through them.

The flow of currents into the output nodes NO1 and NO2 causes a slight voltage rise at the output node NO2 to weakly turn on the transistor TN7, while it also causes a slight voltage rise at the output node NO1 to weakly turn on the transistor TN8.

Since the transistors TN1 to TN4 are already on at this time, the sense currents start to flow into the MTJ elements 1 and 2. The two transistors in each pair of TN1 and TN2, TN3 and TN4, and TN7 and TN8 have the same size respectively, so that the sense currents of the same value flow through the MTJ elements 1 and 2. However, since the MTJ element 1 has the resistance value R1 different from the resistance value R2 of the reference MTJ element 2, a potential difference appears between the bit lines BLT and BLC.

If the resistance value R1 of the MTJ element 1 is higher than the resistance value R2 of the MTJ element 2, the voltage on the bit line BLT becomes slightly higher than the voltage on the bit line BLC to make the voltage OUT at the output node NO1 slightly higher than the voltage OUTN at the output node NO2. This leads the transistor TP2 to a more on-state than the transistor TP3, and the transistor TN8 to a more on-state than the transistor TN7, making the voltage OUT at the output node NO1 increasingly higher than the voltage OUTN at the output node NO2. As a result of the positive feedback, the output node NO1 reaches the power supply voltage and the output node NO2 reaches the ground voltage in a very short time. At this time, the transistors TN7 and TP3 are turned off and hence the MTJ elements 1 and 2 are completely disconnected from the power line VDD.

On the other hand, if the resistance value R1 of the MTJ element 1 is lower than the resistance value R2 of the MTJ element 2, the output node NO2 reaches the power supply voltage and the output node NO1 reaches the ground voltage. At this time, the transistors TP2 and TN8 are turned off and hence the MTJ elements 1 and 2 are completely disconnected from the power line VDD in the same manner.

Thus the sense amplifier 18 accomplishes the amplification of the potential difference between the bit lines BLT and BLC instantaneously, so that very little sense currents flow with very little voltage across the MTJ elements 1 and 2.

Also, after the completion of the amplification, the MTJ elements 1 and 2 are completely disconnected from the power line VDD, so that no sense current flows with no voltage across the MTJ elements 1 and 2.

Figure 4:
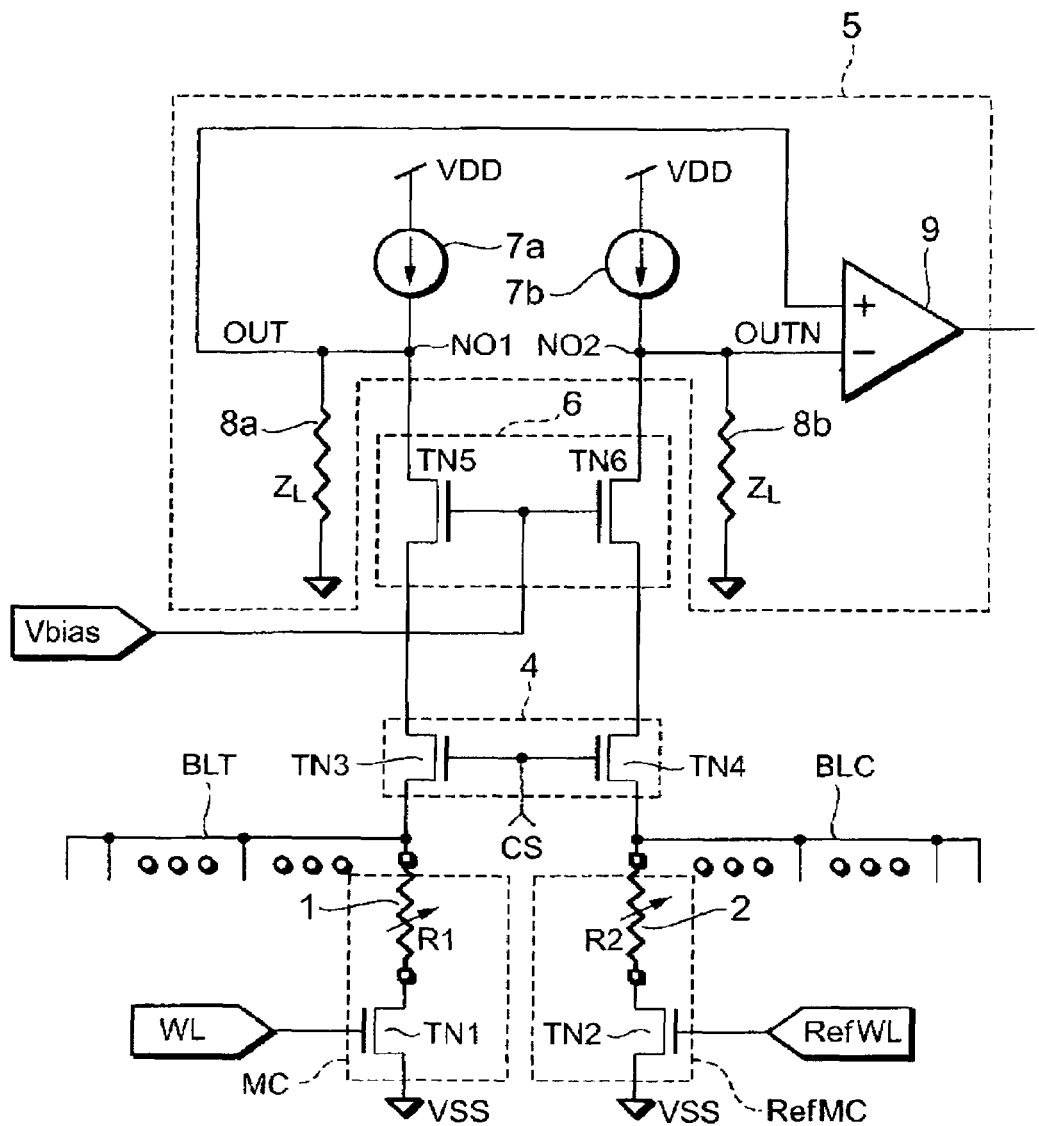
FIG. 4 is a circuit diagram showing a sense-amplifier in a conventional MRAM.

Therefore, there is no need to provide the clamp circuit 6 as shown in FIG. 4 and the bias voltage generation circuit for the clamp circuit. Since the bias voltage generation circuit is not required, there is no DC current flowing through the circuit.

Further, after completion of the amplification, the transistor TP2 or TP3 is turned on to supply current to a circuit (not shown) at the subsequent stage, so that the sense-amplifier 18 can adequately drive the circuit at the subsequent stage even if it has low input impedance. In addition, since the output of the sense-amplifier 18 fully swings between the power supply potential and the ground potential, it is a CMOS-level (rail-to-rail) signal. Therefore, there is no need to provide other amplifiers at the subsequent stages as in the case of the current mirror amplifier 9 shown in FIG. 4. Since the amplifier 9 or any other amplifier is not required at the subsequent stages, there is no DC current flowing through them.

Furthermore, after completion of the amplification, the sense-amplifier 18 functions as a static latch to hold the sensed, amplified data securely as long as the word lines WL and RefWL, the column select signal CS, and the read command signal READN are active. Even if either the word lines WL and RefWL or the column select signal CS is deactivated, one output node NO1 or NO2 is statically maintained at the H level. Although the other node NO1 or NO2 is floating, it is dynamically maintained at the L level. Therefore, when the sense-amplifier 18 is dynamically operated, the word lines WL, RefWL and the column select signal CS can be deactivated in preparation for the next access. This allows the MRAM 10 to start the next read cycle early, thus enabling a reduction of read cycle time.

As discussed above, the sense-amplifier 18 is made up of a smaller number of circuit elements than conventional sense-amplifiers, and it can achieve the high-speed amplification of a potential difference between a pair of bit lines BLT, BLC while reducing the sense current flowing through and the voltage applied to the MTJ elements 1 and 2. Further, since there is no need to provide the bias voltage generation circuit, the amplifier 9, and other amplifiers at the subsequent stages after the amplifier 9, all of which are needed in the conventional structure, no DC current flows, thereby enabling a significant reduction in current consumption.

In the embodiment above, a so-called single cell is used as each magnetic memory cell MC, but a so-called twin cell can be used instead. The twin cell consists of an MTJ element for data storage, an access transistor connected in series to the MTJ element, an MTJ element for reference, and another access transistor connected to the reference MTJ element. In this case, there are no reference memory cells RefMC and reference word lines RefWL. A word line is connected to the gates of the two access transistors so that it is shared between them.

Further, instead of the reference memory cell RefMC, an appropriate reference signal generation circuit may be used.

Further, since the embodiment uses the bit switch 4 made up of the MOS transistors TN3 and TN4, the potential difference appearing across the bit switch transistors when the bit switch is turned on can be changed by changing the gate voltages of the transistors TN3 and TN4. Therefore, it allows the control of the voltage across the MTJ elements, but since the voltages across the MTJ elements 1 and 2 are automatically controlled in the manner mentioned above, the bit switch 4 need not necessarily be designed with MOS transistors.

The embodiment also uses the transistor TP1, but it may be eliminated by connecting the power terminals 203, 223 of the inverters 20, 22 directly to the power line VDD. In this case, it is preferable that the power line VDD itself be connected to the power supply only during the sense-amplification periods, and disconnected from the power supply during the other periods.

In the embodiment, since the transistors TN7 and TN8 are off during standby, even if the transistor TP1 is eliminated and the power terminals 203, 223 of the inverters 20, 22 are directly connected to the power line VDD, no voltage is applied to the MTJ elements 1 and 2. In such a case, however, since direct currents flow via the transistors TP2, TP3, and TN5 and TN6 from the power line to the ground, it is desirable to provide the transistor TP1.

Further, in the embodiment, the output voltages OUT and OUTN are extracted from the output nodes NO1 and NO2 respectively, but only one of the output voltage OUT and OUTN may be used being extracted from the corresponding one of the output nodes NO1 and NO2.

Furthermore, in the embodiment, the transistors TN5 and TN6 are turned off in response to the read command signal READN, but they may be turned off in response to any other signal so that the output nodes will be disconnected from the ground line VSS before activation of the sense amplifier 18. In addition, the N-channel transistors TN5 and TN6 are connected between the output nodes NO1, NO2 and the ground line VSS, but P-channel MOS transistors may be connected between the output nodes NO1, NO2 and the power line VDD instead. In this case, since an inversion signal of the read command signal READN is applied to the gates of the P-channel MOS transistors, the transistors TP2 and TP3 are turned off and the transistors TN7 and TN8 are turned on during standby. However, the transistors TN3 and TN4 are off, so that no voltage is applied to the MTJ elements 1 and 2.

Although the above describes the embodiment of the present invention, the aforementioned embodiment is just an illustrative example of implementing the invention. Therefore, the present invention is not limited to the aforementioned embodiment, and appropriate modifications can be carried out without departing from the scope or essential characteristics of the present invention.

The magnetic memory device according to the present invention is widely applicable to use as a general-purpose memory, and it is particularly effective for use in memory-equipped portable devices.

We claim:

1. A magnetic memory device comprising a first power supply and a second power supply, and further comprising:
   a) a word line;
   b) a pair of bit lines;
   c) a magnetic memory cell, said magnetic memory cell connected to the word line and to the pair of bit lines, and further comprising a magnetic resistor element connected between said pair of bit lines and the second power supply, and an access transistor having a control terminal connected to said word lines, the access transistor being connected in series to said magnetic resistor element; and
   d) an amplifier circuit,
      i) said amplifier circuit connected to said pair of bit lines for sensing the current in said magnetic memory cell,
      ii) said amplifier circuit comprising a first inverter including an output terminal connected to a first output node,
      iii) an input terminal connected to a second output node,
      iv) the first power terminal connected to a first power supply, and a second power terminal connected to said pair of bit lines,
      v) a second inverter including an output terminal connected to the second output node,
      vi) an input terminal connected to the first output node,
      vii) a first power terminal connected to the first power supply, and a second power terminal connected to the other of said pair of bit lines;
      viii) power-off means for shutting off the power supply to said amplifier circuit during standby, said power-off means including a switching element connected between the first power supply and the first power terminal of said first inverter;
      ix) a first switching element connected between the second output node and the first or second power supply; and x) a second switching element connected between the first output node and the first or second power supply;

said magnetic memory device further comprising a bit switch connected between said amplifier circuit and said bit line pair and turned on in response to a column select signal from a column decoder.

2. The magnetic memory device according to claim 1, wherein said first inverter comprises a first conductive transistor having a one-side conducting terminal connected to the first power supply, an other-side conducting terminal connected to the first output node, and a control terminal connected to the second output node, and a second conductive transistor having a one-side conducting terminal connected to one of said pair of bit lines, an other-side conducting terminal connected to the first output node, and a control terminal connected to the second output node, and said second inverter comprises a first conductive transistor having a one-side conducting terminal connected to the first power supply, an other-side conducting terminal connected to the second output node, and a control terminal connected to the first output node, and a second conductive transistor having a one-side conducting terminal connected to the other of said pair of bit lines, an other-side conducting terminal connected to the second output node, and a control terminal connected to the first output node.

3. The magnetic memory device according to claim 1, wherein said amplifier circuit further comprises power-off means for shutting off the power supply to said amplifier circuit during standby.

4. The magnetic memory device according to claim 1, wherein each of said amplifier circuits further comprises reset means for precharging the first and second output nodes to a predetermined voltage during standby.

5. The magnetic memory device according to claim 1, wherein each of said amplifier circuits further comprises turn-off means for turning off the second conductive transistor of said first inverter during standby.

* * * * *